United States Patent [19]
Landers et al.

[11] Patent Number: 5,635,911
[45] Date of Patent: Jun. 3, 1997

[54] APPARATUS AND METHOD FOR MONITORING AN ARTICLE DISPENSING DEVICE SUCH AS A SEED PLANTER AND THE LIKE

[75] Inventors: David J. Landers, Rochester; Gregry C. Miller, Taylorville; Kevin P. McEnaney; Scott A. Holmstrom, both of Springfield, all of Ill.

[73] Assignee: Dickey-john Corporation, Auburn, Ill.

[21] Appl. No.: 438,946

[22] Filed: May 11, 1995

[51] Int. Cl.$^6$ ............................................. G08B 21/00
[52] U.S. Cl. ................... 340/674; 111/903; 250/222.2; 377/6; 395/900
[58] Field of Search ........................... 340/673, 674, 340/684, 627; 377/53, 6, 11; 111/903; 250/222.1, 222.2, 223 R; 395/3, 61, 900, 904, 912; 364/274.6

[56] References Cited

U.S. PATENT DOCUMENTS

| | | | |
|---|---|---|---|
| 4,149,163 | 4/1979 | Fathauer | 340/684 |
| 4,164,669 | 8/1979 | Knepler | 310/15 |
| 4,166,948 | 9/1979 | Steffen | 250/214 B |
| 4,239,010 | 12/1980 | Amburn | 342/70 |
| 4,246,469 | 1/1981 | Merlo | 377/6 |
| 4,333,096 | 6/1982 | Jenkins et al. | 340/684 |
| 4,555,624 | 11/1985 | Steffen | 250/223 R |
| 4,635,215 | 1/1987 | Friend | 364/555 |
| 4,675,520 | 6/1987 | Harrsen et al. | 250/222.2 |
| 4,782,282 | 11/1988 | Bachman | 324/668 |
| 5,222,191 | 6/1993 | Enomoto | 395/3 |
| 5,245,695 | 9/1993 | Basehore | 395/3 |
| 5,260,875 | 11/1993 | Tofte et al. | 364/424.07 |
| 5,261,036 | 11/1993 | Nakano | 395/61 |
| 5,281,810 | 1/1994 | Fooks et al. | 250/222.1 |
| 5,307,443 | 4/1994 | Tanaka | 395/3 |
| 5,321,639 | 6/1994 | Krishnamoorthy et al. | 364/606 |
| 5,324,931 | 6/1994 | Fooks et al. | 250/222.1 |
| 5,336,882 | 8/1994 | Fooks et al. | 250/221 |
| 5,339,365 | 8/1994 | Kawai et al. | 382/176 |
| 5,347,117 | 9/1994 | Fooks et al. | 250/221 |

FOREIGN PATENT DOCUMENTS

| | | | |
|---|---|---|---|
| 587898 | 1/1978 | U.S.S.R. | 111/903 |
| 1782392 | 12/1992 | U.S.S.R. | 111/903 |

*Primary Examiner*—Thomas Mullen
*Attorney, Agent, or Firm*—Leydig, Voit & Mayer, Ltd.

[57] ABSTRACT

An apparatus and method for accurately counting the number of articles passing along an article path. A light beam is transmitted across an article path to a sensor, which light beam is interfered with by the passage of articles along the article path and the received light beam is converted to electrical signals that are conditioned, amplified and input to a logic unit which, based on derived amplitude, duration and area of the input signals, determines the number of articles that passed along the article path. A system is also described which accurately counts the number of articles passing along a plurality of article paths by employing a plurality of such devices each of which accurately counts the articles passing along each article path and, upon instructions from a master console, sends its counts to the master console for summation. The system further includes a network architecture with simplified wire harnessing and enhanced operation.

30 Claims, 11 Drawing Sheets

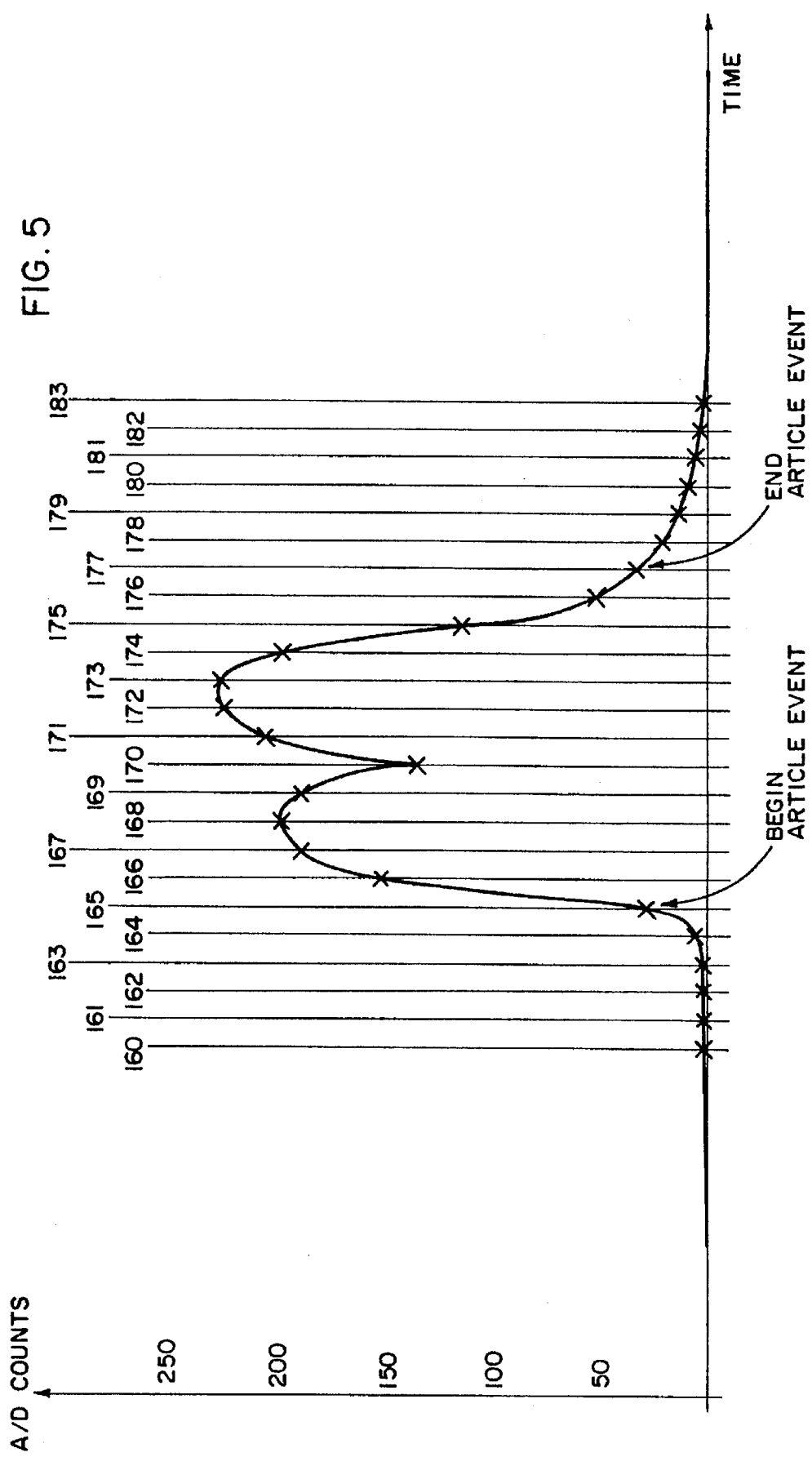

APPARATUS AND METHOD FOR MONITORING AN ARTICLE DISPENSING DEVICE SUCH AS A SEED PLANTER AND THE LIKE

FIELD OF THE INVENTION

The present invention relates generally to a signal generating and processing device useful for counting articles passing along an article path and to a system of signal generating and processing devices useful for counting a total number of articles passing along a plurality of article paths.

BACKGROUND OF THE INVENTION

It is often desirable for an equipment operator to know the rate and quantity of articles being dispensed by certain dispensing equipment. For example, farmers who use mechanized equipment to plant agricultural products must know the quantity of seeds that are being dispensed by the mechanized planting equipment in order to optimize crop production and yield in a given area. Often, a farmer must know the quantity of seeds being planted in each row by the mechanized planter in order to optimize production.

To provide rate and quantity information to farmers and other operators of equipment, a variety of sensors and systems have been developed which are capable of detecting that an article has passed along or through a predetermined path and displaying a total count representative of the total number of articles that are detected. In the case of mechanized seed planting equipment, most of the detecting sensors utilize electro-optical transducers which receive a light beam transmitted across a seed tube which light beam is interrupted or interfered with by the passage of seeds through the tube. Every time the light beam is interrupted or sufficiently diminished below some predetermined threshold, a "seed event" is said to occur and, for each seed event, the sensors typically send a signal to a central monitor which adds a count to the total count and displays the total count and other information.

These systems often miscount the number of seeds passing along the seed paths. For example, dirt or dust in and around the seed path can interrupt or reduce the light signal beneath the threshold of the optical sensor and thereby trigger a seed count which is higher than the actual number of seeds which passed through the seed path. Another error occurs when two or more seeds are lumped closely together as they travel through the seed tube. Because these closely lumped seeds interrupt the light beam only once, the sensor only "detects" a single seed and will count a lower number of seeds than the actual number which passed through the seed path. Yet another error occurs when one or more of the light beam emitters malfunctions and the counting system has no way of detecting that the emitters are not working properly.

Certain prior systems have employed electronic noise compensating circuitry in order to reduce the erroneous counts associated with dirt or other non-articles. Other systems have focused on the rate of change of the signal from the optical sensor in order to better detect closely overlapping articles or seeds. Still other systems have addressed the problem of discriminating between closely overlapping seeds by providing an optical sensing device with complicated mirrors and lenses which serve to create and maintain a more uniform light field.

Nonetheless, with the need to accommodate ever increasing dispensing rates, driven by the need to increase productivity, there is a need for a system that provides even greater accuracy at higher dispensing rates, where the probability of overlapping articles is great, coupled with the need for such a system that simplifies installation, set-up and maintenance and provides the operator with more detailed information relating to the performance of the seed planter or other article dispensing devices.

OBJECTS AND SUMMARY OF THE INVENTION

It is therefore the general object of the present invention to provide a signal generating and processing device which accurately counts articles passing along an article path.

It is another object of the invention to count articles by providing a novel circuit and logic arrangement which uses a detecting-circuit, a signal generator which generates electrical signals in proportion to the number of articles detected, if any, and a signal processing device which receives electrical signals and generates and stores further signals, at least one of which is representative of the number of articles passing along the article path.

It is another object of the invention to improve device counting accuracy while using conventional optical emitters and receivers placed in a conventional arrangement.

Yet another object of the invention is to accurately count the number of articles by measuring and utilizing physical properties of the articles passing along the article path.

It is a further object of the invention to ascertain the number of articles passing through the article path by using fuzzy logic.

Another object of the invention is to determine when a seed was erroneously not counted.

It is a further object of the invention to provide a system which integrates a plurality of signal generating and processing devices, each of which accurately counts the number of articles passing along an article path.

A related object of the invention is to provide a system with a central unit which is capable of requesting information from individual signal generating and processing units.

Similarly, it is an object of the invention to provide a system with a central unit which is capable of testing and directing the activities of individual signal generating and processing units.

Lastly, it is an important object of the invention to simplify wire harnessing in a system having a plurality of article detectors.

The foregoing and other objects and advantages are accomplished by the present invention which includes a system of signal generating and processing units, each corresponding to an article path and linked to a master console and to other signal generating and processing units via a network. In the system, the master console may address each signal generating and processing unit individually or as an entire group and may direct the activities of each unit or request information from each unit by generating, transmitting and receiving electronic information packets on the network. During typical operation, the master console requests and receives an ongoing count from each signal generating and processing unit which represents the total number of articles which have passed through that unit's article path. The master console stores and accumulates each unit's total number of articles and generates a system total which is representative of the total number of articles dispensed by the entire dispensing system.

The invention provides for a series of signal generating and processing units, each of which accurately counts a number of articles being dispensed through a single article path. Each signal generating and processing unit may use a conventional detecting circuit such as an LED light emitter and a photosensor arranged in a conventional manner to detect articles passing through article paths. However, the detecting circuit may be other than a conventional light emitter and receiver combination and may incorporate other light or electro-magnetic transducing means and still be within the scope of the invention. For example, the detecting circuit may incorporate non-intrusive sensors such as ultrasonic, microwave, capacitance or capaciflector sensing type devices.

Each signal generating and processing unit generates an accurate count of the number of articles passing through its associated article path by providing means for modifying and analyzing at least the signal produced by the detecting circuit. In the preferred embodiment, the signal generated by the detecting circuit is modified by an amplification factor determined by the physical characteristics of preceding articles and is thereafter sampled by a microprocessor which generates a digital count signal representative of the analog magnitude of the signal. Under software control, the microprocessor compares the digital signal with a predetermined threshold and, if the digital signal is greater than the threshold signal, the microprocessor determines that a seed event is occurring. After the beginning of a seed event, the microprocessor periodically generates at least a duration signal which is representative of the length of time since the beginning of the seed event and an area signal which is representative of the integral of the digital signal over the duration of the seed event.

After the detector circuit's output signal drops below a predetermined value, the microprocessor determines that the seed event has ceased, and the microprocessor stores the cumulative duration signal and the cumulative area signal in memory. Based on at least the cumulative duration signal and the cumulative area signal, the microprocessor then determines the number of seeds which passed during the seed event by using fuzzy logic. In one embodiment, the number of articles that passed the detector during the seed event is determined in part by obtaining a number stored in a multi-dimensional data structure representative of fuzzy logic rules and indexed by signals such as the duration signal and the area signal. The signal processing unit also calculates and stores nominal values of duration and area and other relevant variables for a predetermined number of seed events. After the predetermined number of seed events has occurred, the signal processing units recalculate the nominal values necessary for implementing the fuzzy logic.

Accordingly, the present invention provides an improved article counting method and apparatus having one application in the area of counting and monitoring seeds being planted in a field. The present invention thus may provide a seed or planter monitoring system having enhanced accuracy particularly where the seed planting rate is high and the probability of overlapping seeds passing the detector is great. The enhanced accuracy is achieved with ordinary and inexpensive sensors. Moreover, the system can readily and automatically adapt to different size articles or seeds, thus making the set-up procedure easier and more fool-proof for the human operator. Likewise, the system can automatically adapt to changing or degrading operating conditions, such as the gradual build-up of dirt or the like, without any loss of performance. The present invention further makes possible the use of greatly simplified wiring harnesses, further improving overall system reliability. The architecture of the present invention also permits the use of interchangeable sensor units, thereby simplifying inventory requirements and expediting the delivery of spare or replacement units to a customer, while retaining the ability of the system to differentiate the units installed in the system. Accordingly, the method and apparatus of the present invention has greatly improved fault detection capabilities, resulting in a more robust article or seed monitoring system.

BRIEF DESCRIPTION OF THE DRAWINGS

FIG. 5 is a graph of magnitude versus time of a typical photodetector output signal as modified by an inverting and selectively amplifying circuit.

DETAILED DESCRIPTION OF THE PREFERRED EMBODIMENT

Figure 1:
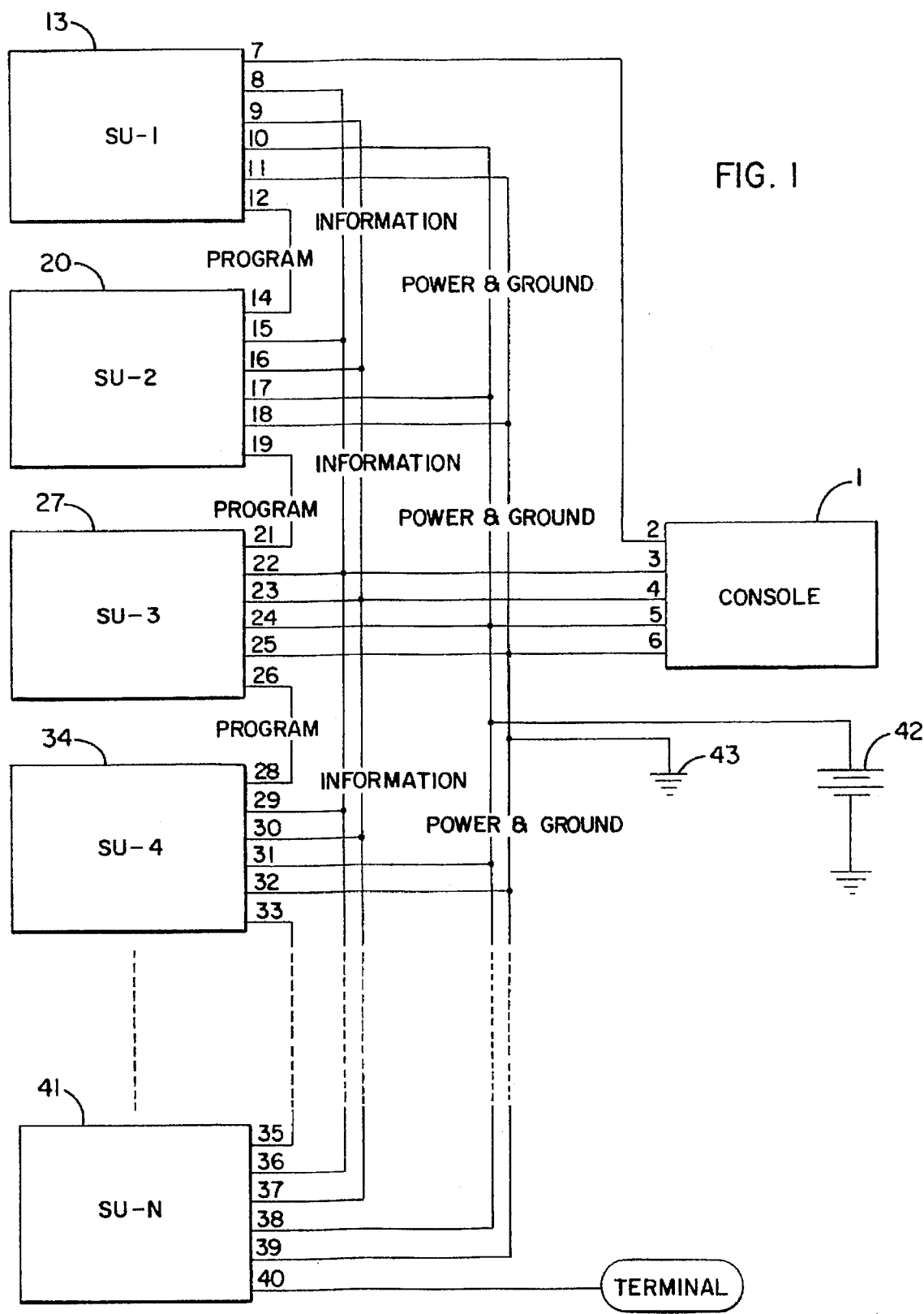
FIG. 1 is a block diagram of a system of individual signal generating and processing units linked together in accordance with the invention.

In FIG. 1, a block diagram is shown of a system which uses a plurality of individual signal generating and processing units ("signal units") 13, 20, 27, 34 and 41, linked to one another and to a master console 1 to accurately count the total number of articles being dispensed by a dispensing apparatus along a plurality of article paths. The dispensing system of FIG. 1 may be an agricultural planting system which dispenses agricultural seeds, such as soybean seeds, in multiple planting rows. Each signal unit, e.g. 13 (SU-1), counts the number of articles passing along a single article path and is linked to other signal units and to the master console via an electronic network. The network bus is comprised of five conductors including a power conductor, a ground conductor, two conductors comprising an information path, and a fifth conductor which links individual units to one another and to the master console in a daisy chain fashion. The conductors may be conventional conductors or may be fiber optic type conductors.

Although the five conductor network is one embodiment of the invention, other embodiments are contemplated for the network. In one alternative embodiment, power and ground are separately provided and not provided as network conductors. This results in a simplified three conductor network. Another alternative embodiment is to eliminate the information carrying conductors through the use of wireless communications devices. Thus, radio frequency transmitters and receivers or laser light transmitters and receivers may be used to convey information in the system. Yet another alternative embodiment uses the power conductor to both supply power and convey information. In this embodiment, only three conductors are required to implement the invention.

The invention requires a master console 1 and an individual signal unit, e.g. 13 (SU-1), for each article path of the dispensing system wherein each individual signal unit is responsible for counting a number of articles dispensed along an associated article path and the master console 1 is responsible for computing the total number of articles dispensed along all article paths based on information received from each signal unit. In the case of a seed planting system for dispensing agricultural seeds, the invention requires an individual signal unit for each row where seeds are being dispensed.

The number of signal units, e.g. 13 (SU-1), required for the invention is therefore variable depending on the requirements of the dispensing system. For illustration purposes, FIG. 1 shows five signal units 13 (SU-1), 20 (SU-2), 27 (SU-3), 34 (SU-4) and 41 (SU-N) with dashed lines illustrated between the interconnections of SU-4 and SU-N. The dashed lines represent any possible further signal units which may be required by the dispensing system. Hence, the final illustrated signal unit is designated as SU-N where N is the number of signal units in a particular system.

The number of system article paths which may be counted is limited by the number of signal units, N, which may be incorporated in the system of FIG. 1. The number of signal units, N, which may be added to the system is limited by the addressing capability of the master console as well as the ability of the network to convey information to a certain number of nodes. In the preferred embodiment, the master console 1 can address a maximum of 249 signal units but, due to inherent limitations in the preferred communication system of the network, the network communication system can support only 127 signal units. An alternate more powerful network may be employed, such as a network with additional amplifiers and signal repeaters, and the maximum number of signal units, N, would thereafter be limited by the master console 1 addressing capability.

The master console addressing capability is determined by the addressing protocol of the network, described in more detail below, which, for the preferred embodiment, uses a one byte data element that allows for 256 unique addresses with the system reserving 7 unique addresses for the master console 1 default address and for global addressing. However, if a more powerful network was employed, the protocol may be easily modified to include two or more bytes of addressing information which would extend the addressing capability to 65,536 signal units, or beyond.

FIG. 1 schematically illustrates the five conductor electrical network bus of the invention. The first conductor of the five network conductors is a power cable which is supplied by a 9–16 volt direct current (DC) battery 42 typical of most automobile and farm vehicles. The power is carried from the power supply 42 along a power cable in the network and is applied to the master console and signal units SU-1 through SU-N. In FIG. 1, the schematic illustrates that the power from supply 42 is carried along a single line and is connected to the master console at connect point 5, signal unit 13 (SU-1) at connect point 10, signal unit 20 (SU-2) at connect point 17, signal unit 27 (SU-3) at connect point 24, signal unit 34 (SU-4) at connect point 31, and the last signal unit (SU-N) at connect point 38. Although FIG. 1 illustrates the power supply as a DC battery, it should be noted that other power supplies, such as alternating current ("AC") power supplies, may also be utilized with appropriate signal rectification and conditioning either at or before the power is input to the master console or to a signal unit.

The second conductor in the five conductor network is a "ground" conductor. This network conductor insures that the master console and all signal units have a single common ground potential which reduces the possibility that information conveyed along the network will be affected by signal units "floating" at various differing electrical ground potentials. To prevent damage to the master console or signal units from feedback or voltage spikes, the ground 43 may be a "clean" ground that is not shared with other vehicular electrical or electronic equipment. In FIG. 1, the schematic illustrates that the ground is connected to the master console at connect point 6, signal unit 13 (SU-1) at connect point 11, signal unit 20 (SU-2) at connect point 18, signal unit 27 (SU-3) at connect point 25, signal unit 34 (SU-4) at connect point 32, and the last signal unit (SU-N) at connect point 39.

The third and fourth conductors of the five conductor network bus are the information carrying conductors for the network. In a preferred embodiment, these conductors are cables that carry information signals conforming to the RS-485 type transceiver standard. The information carried over these cables, as described in more detail below, is low power digital information transmitted in a half-duplex or unidirectional manner only. Thus, only one information signal may be carried at a time on these two conductors. In FIG. 1, network connections for the information conductors are made at the master console at connect points 3 and 4, signal unit 13 (SU-1) at connect points 8 and 9, signal unit 20 (SU-2) at connect points 15 and 16, signal unit 27 (SU-3) at connect points 22 and 23, signal unit 34 (SU-4) at connect points 29 and 30, and the last signal unit (SU-N) at connect points 36 and 37. Although one embodiment may use an RS-485 half duplex standard for conveying information on the network, other embodiments of the invention include conventional local area network (LAN) configurations, such as token ring or ethernet, which may be substituted for the RS-485 or RS-422 type configuration.

The fifth and final conductor in the electrical network bus is comprised of a plurality of single "program line" conductors which connect a single node on the network to the next node in a daisy chain fashion. This program line conductor is to be contrasted to the other conductors, power, ground, and information conductors, which are shared by and connected to every node on the network. As shown in FIG. 1, program line conductors electrically connect the master console 1 at connect point 2 to the first signal unit 13 (SU-1) at connect point 7, the first signal unit 13 (SU-1) at connect point 12 to the second signal unit 20 (SU-2) at connect point 14, the second signal unit 20 (SU-2) at connect point 19 to the third signal unit 27 (SU-3) at connect point 21, the third signal unit (SU-3) at connect point 26 to the fourth signal unit (SU-4) at connect point 28, and the fourth signal unit (SU-4) at connect point 33 to the final signal unit (SU-N) at connect point 35. The final signal unit (SU-N) also has a program line conductor which, in the preferred embodiment, is left floating and pulled to a logic low level internal to the signal unit. An explanation of the system functions will be given after an individual signal unit is described.

Figure 2:
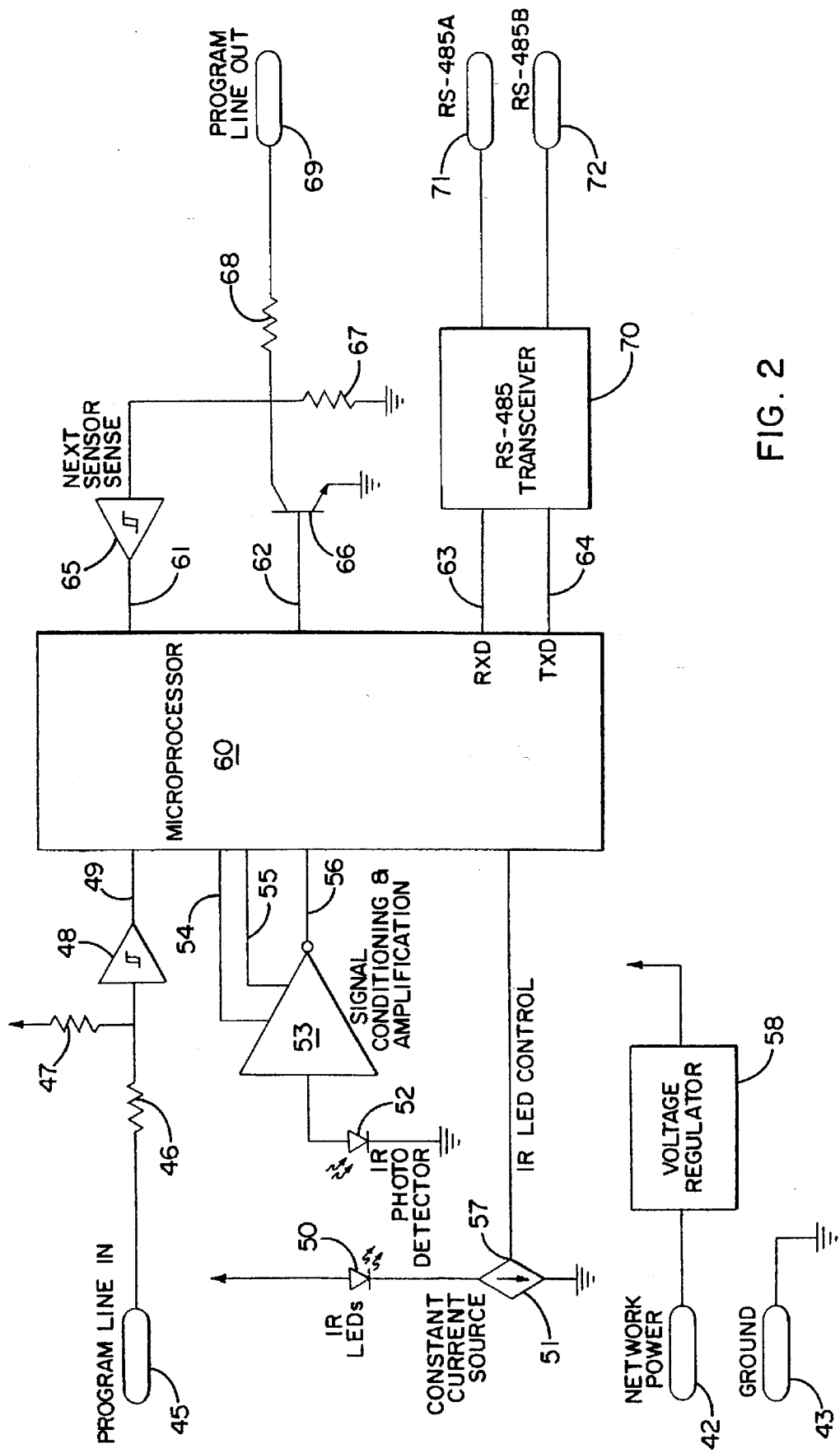
FIG. 2 is a schematic representation of an individual signal generating and processing unit.

FIG. 2 schematically illustrates a typical signal unit. In a preferred embodiment, each signal unit generally includes at least a beam generator 50 and photodetector 52, circuitry for amplifying and conditioning the detector output 53, system communications circuitry, and a microprocessor 60 which receives the modified photodetector signals, generates additional signals from the modified photodetector signal, and stores an accurate count of articles passing along the article path. Each of these components will be explained individually followed by an explanation of the entire signal unit operation.

The beam generator and detector of the typical signal unit are infrared light emitting diodes ("LEDs") 50 which transmit an infrared light beam across an article path where it is received by a photodetector 52 which generates an electrical signal proportional to the light incident on the photodetector. Other types of LEDs may be substituted for the infrared LEDs. For example, LEDs 50 may be visible red or visible green light emitting diodes. For schematic simplicity, the beam generator and receiver is shown as a single LED 50 and a single photodetector 52. Although a preferred embodiment utilizes three LEDs to provide enhanced beam generation over the article path, it is noted that different combinations of LEDs and photodetectors may also be used to transmit and receive a plurality of light beams across the article path.

The LEDs 50 and the photodetector 52 are well known components which are mounted in a conventional manner along the article path such that an article, e.g. seed, passing along or through the article path will cross through and interfere with the beam generated by the LED 50 and received by photodetector 52. This manner of mounting LEDs and photodetectors is known in the art and one example of such a mounting with a single LED and dual photodetectors is described in U.S. Pat. No. 4,166,948 which is hereby incorporated by reference.

In ordinary operation, the LEDs 50 output a constant infrared beam which is received by the photodetector 52. The LEDs 50 are supplied with power from the network power cable. Although the power supplied from the network power supply 42 may be conditioned prior to being received by an individual signal unit, the signal unit may also include a voltage regulator 58 which further conditions the power signal.

In order to generate the constant beam, electrical current through the LEDs 50 is regulated by constant current source 51. Constant current source 51 has an input 57 from microprocessor 60 and, depending on this input, is switchable to either generate a constant regulated current, in which case LEDs 50 produce a beam, or to generate little or no current, in which case LEDs 50 do not produce a beam. Thus, microprocessor 60, via constant current source 51, has the ability to switch the LEDs' beam on or off. This ability allows the microprocessor 60 to test the operability of the LEDs 50 and determine whether the LEDs are malfunctioning. This feature of the invention is described in more detail below.

Photodetector 52 receives the constant beam generated by LED 50 and generates an electrical signal which is proportional to the intensity of the LED beam. The electrical signal generated by photodetector 52 when no articles are passing through the article path is a constant level voltage signal. However, once an article passes through the article path and crosses or interferes with the beam, the resultant voltage of the electrical signal output by the photodetector will diminish in proportion to the amount of the beam which is blocked by the passing article. The signal that is generated by photodetector 52 is therefore modulated by the passage of articles along the article path and will have varying and negative excursions from a constant baseline signal as articles interfere with the beam.

The photodetector signal contains essential information about the quantity of articles that passed along the article path. However, before the information may be extracted from the photodetector signal, significant further processing of the photodetector signal must be performed. Shown in block form in FIG. 2 is a signal conditioning and amplification circuit 53 electrically linked to the photodetector 52. Circuit 53 operates to amplify and invert the negative direction excursions of the photodetector signal that resulted when the signal was modulated by the passage of articles along the article path. Signal conditioning of the photodetector output is necessary because the negative going excursions of the signal may be small with respect to the overall signal levels of the circuit and must be amplified for later processing by microprocessor 60.

Figure 3:
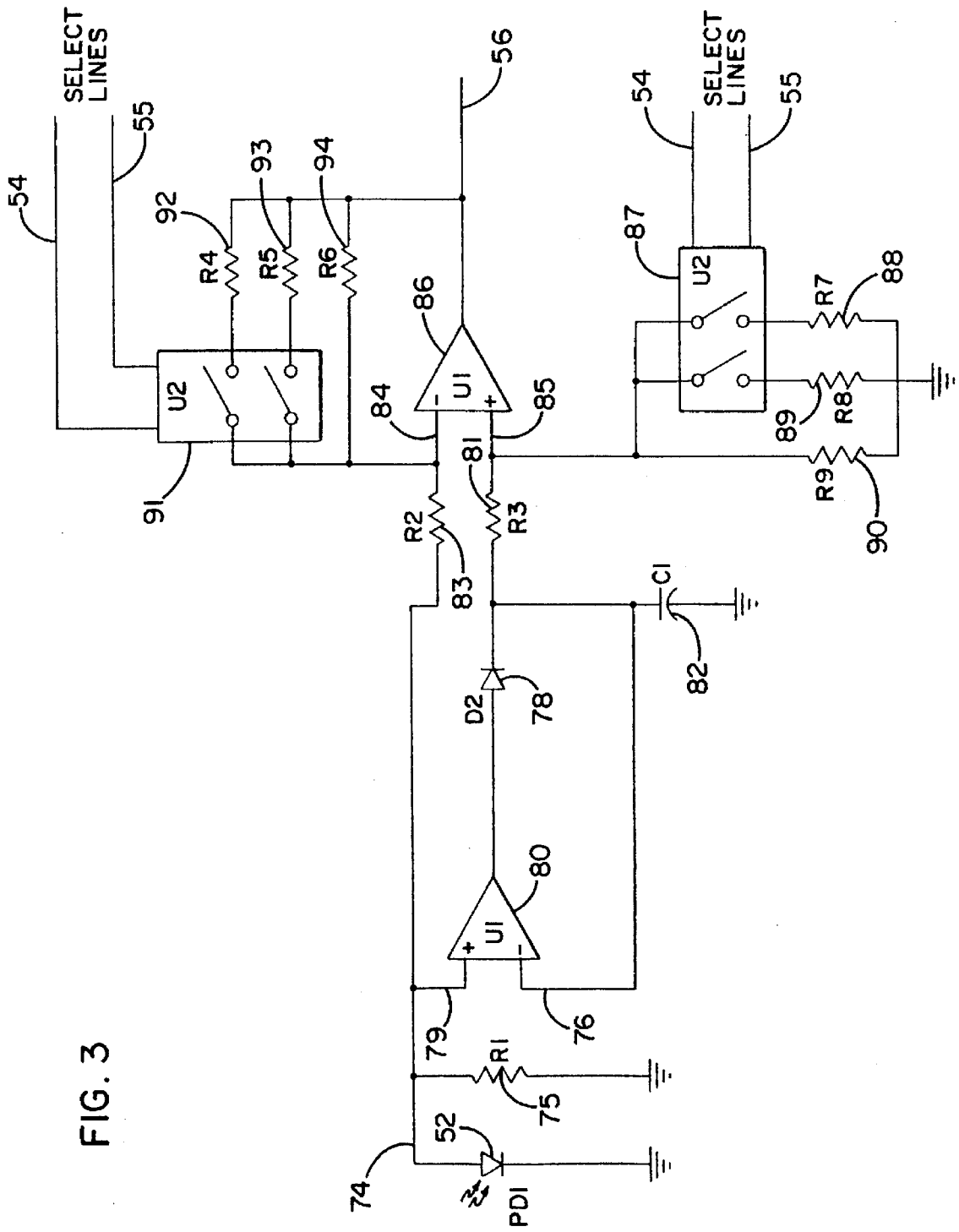
FIG. 3 is a schematic representation of an individual signal generating and processing unit's gain control selection circuit.

FIG. 3 is a more detailed schematic of the block representation of circuit 53 of FIG. 2. Circuit 53 is mainly comprised of two circuits: a peak detector circuit and a difference amplifier circuit. The function of the peak detector circuit is to establish the peak value for the photodetector signal and the function of the difference amplifier circuit is to amplify the difference between the varying photodetector signal and the peak value of the varying photodetector signal.

The peak detector sub-circuit of circuit 53 is shown in FIG. 3 and comprised of resistor 75, operational amplifier 80, diode 78, and capacitor 82. In the preferred embodiment, the peak detector sub-circuit receives the varying signal of the photodetector 52 and produces a constant output signal which corresponds to the highest value, i.e. peak value, of the varying signal. The output of the peak detector is therefore the same as the output of photodetector 52 when no articles are interfering with the beam because, as noted above, photodetector 52 produces its highest output when it receives an uninterrupted light beam. It is noted however that any peak detector circuit which is capable of detecting and holding the highest output from photodetector 52 may be an acceptable substitute for the circuit illustrated in FIG. 3.

The inverting difference amplifier is defined by resistors 81 and 83, operational amplifier 86, a first resistive network comprising switch 87 and resistors 88–90, a second resistive network comprising switch 91 and resistors 92–94, and the output line 56. The difference amplifier subcircuit of circuit 53 is configured to subtract the varying photodetector signal from its peak and to amplify the difference. The peak value is supplied from the peak detector sub-circuit as described above. The subtraction of the varying signal from the peak signal will always produce a signal that is zero or greater than zero because the varying signal is always less than or equal to the peak output of the varying signal. Thus, the output of this amplifier circuit will always be zero or positive.

The output signal of the inverting difference amplifier circuit is found at line 56 and is mathematically stated as the difference between the peak detector input, as multiplied by a first constant, and the varying photodetector input, as multiplied by a second constant. The value of the first constant is determined by the values of resistors 81 and 83 and the equivalent resistive values of the first and second resistive networks. The value of the second constant is determined solely by the value of resistor 83 and the equivalent resistance of the second resistive network.

The equivalent resistances of the resistive networks are dependent on switches 87 and 91 because the equivalent resistances change as these switches close. This change in resistance occurs because the closing or opening of the switches places additional resistors ("switchable resistors")

in parallel with the permanently connected resistors. For example, in the first resistive network, switchable resistors 88 and 89 are placed in parallel with permanent resistor 90. If switch 87 closes such that resistor 88 and/or 89 become electrically in parallel with permanent resistor 90, the equivalent resistance of the network will drop. Likewise, for the second resistive network, switch 91 controls switchable resistors 92 and 93 which effects the equivalent resistance of the second resistive network.

From the foregoing, it is clear that the operation of switches 87 and 91 control the equivalent resistive values of the first and second resistive networks which in turn control the values of the multiplying constants which in turn control the amplification or gain of the circuit. Thus, the gain of the amplification circuit is completely dependent on the operation of switches 87 and 91.

Switches 87 and 91 are electronic relays or analog multiplex devices which, upon receiving appropriate input from microprocessor 60 over select lines 54 and 55, will effectively cause current to flow in the areas represented by the schematic switches in FIG. 3. Four separate switch positions are possible for each switch 87 and 91 because of the two select lines 54 and 55. The select lines for the electronic relays or analog multiplex devices are supplied from microprocessor 60 which, as described in more detail below, will send signals over the select lines to select an appropriate gain for the amplifier circuit. Thus, depending on the signals at the selection lines 54 and 55, circuit 53 will receive the photodetector circuit and modify it such that any signal excursions are positive and amplified.

Figure 4:
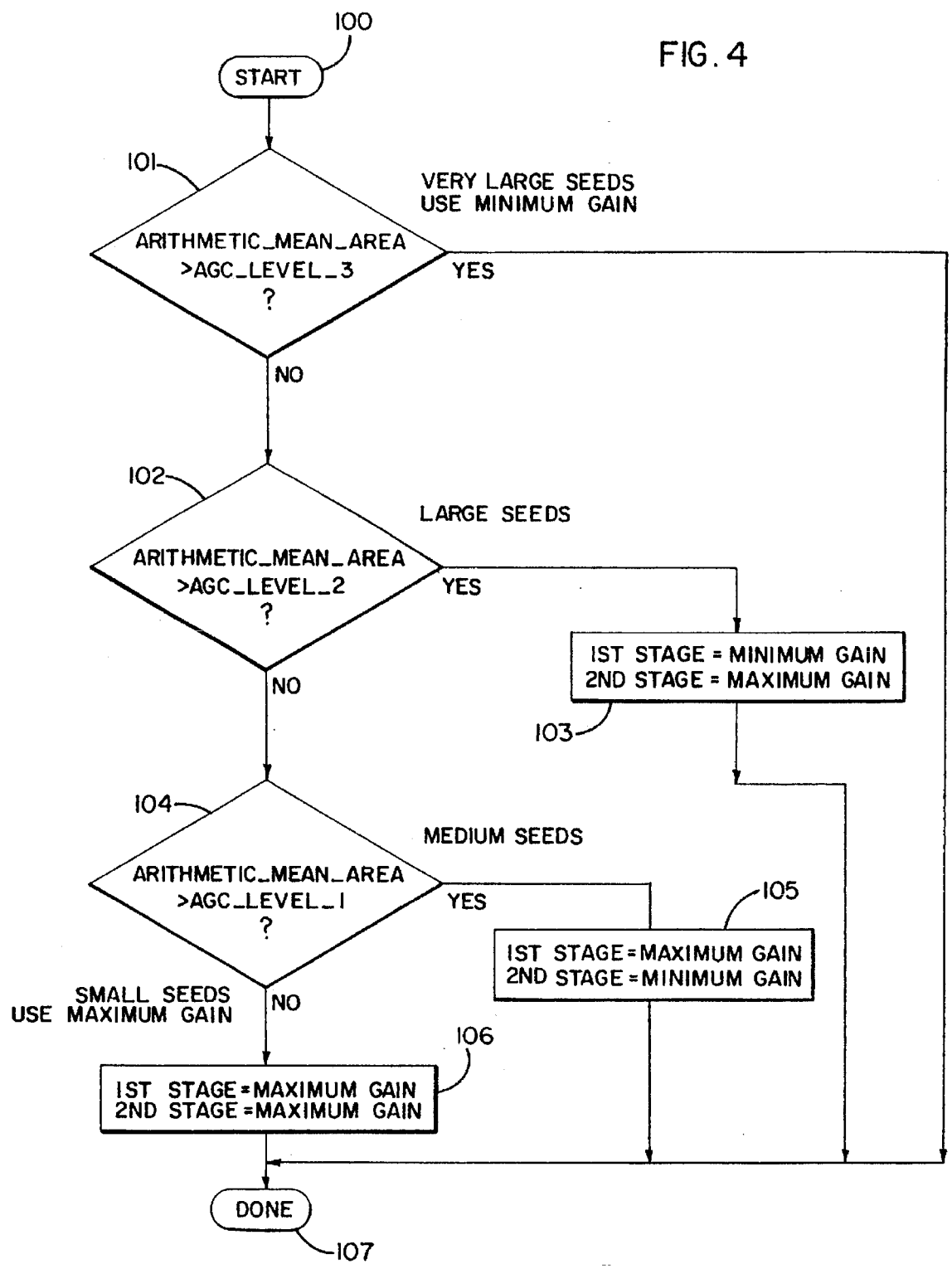
FIG. 4 is a diagram representing the flow sequence which is used for selecting the gain for the detecting circuit.

FIG. 4 illustrates the flow diagram that is used by microprocessor 60 to select the amount of amplification by circuit 53. In ordinary operation, microprocessor 60 will select an amplification level which is dependent on the physical size of the articles passing along the article path. If the articles are very large, microprocessor 60 will only slightly amplify the output signal. However, as the articles diminish in size, microprocessor 60 increases the amplification level. In the flow diagram of FIG. 4, microprocessor 60 determines whether the articles are very large, large, medium or small and then sets the appropriate level of amplification. The microprocessor makes this determination by comparing the average mean area of the articles with three predetermined thresholds. Although this process is described in more detail below, for present purposes it is sufficient to note that the amplification is set based on the sizes of articles passing along the article path.

Returning now to the typical signal unit of FIG. 2, it is noted that microprocessor 60 interconnects the various components of the signal unit. This device is responsible for partially controlling the signal unit's beam generation device, partially controlling the amplification and conditioning of the photodetector's output, and generating and maintaining an accurate count of articles passing along the article path based on the photodetector signal as modified by circuit 53. The microprocessor 60 also controls all data communications between the signal unit and the network over the network bus information lines. In controlling the data communications, the microprocessor 60 receives the program line signal from the master console or prior signal unit, determines whether a next signal unit is present and transmits appropriate program line signals, as directed by the master console, to the next signal unit.

The microprocessor of a preferred embodiment may be a commonly available 80C550 microprocessor. The 80C550 is preferred because, in addition to its central processor, it has random access memory (RAM), read only memory (ROM), an eight channel/eight bit analog to digital convertor, three input ports, and a serial universal asynchronous receiver and transmitter (UART) built into the single integrated circuit device. Thus, although other microprocessors may be substituted with some or all of the listed components attached as peripheral devices, it is desirable to use the 80C550, or other suitably equipped microcontroller, because of the convenient single integrated circuit design.

Microprocessor 60 receives and converts the modified detector signal from circuit 53 to a digital signal. As noted above, in a preferred embodiment, microprocessor 60 has a built in 8-channel/eight bit analog to digital convertor which samples the analog input signal at a predetermined frequency and returns binary digital value signals. Depending on the size of various articles and the various rates at which various articles travel along their paths, the predetermined sampling frequency of the analog to digital convertor may vary. In a gravity seed dispensing environment, it is desirable to sample the output of circuit 53 at least once every 200 microseconds or, equivalently, at a 5 kHz sampling rate.

Data communication with the network is also controlled via microprocessor 60. The microprocessor 60 performs three communications functions: receiving the "program line" input 45 from a logically preceding device, transmitting a "program line" output 69 to a logically subsequent device if present, and interpreting serial data from the RS-485 transceiver 70. As described above, the program line input 45 will be connected to the master console if the signal unit is the first signal unit in the system. If not, the program line input 45 will be connected to the program line output of the logically preceding signal unit.

The program line signal is a digital signal which is input to every signal unit's microprocessor. The program line input, although input to every signal unit, is only used by the master console. The primary function of the program line signal is to individually address each particular signal unit. In FIG. 2, the program line signal is input to the microprocessor 60 through Schmitt trigger 48. Schmitt triggers, such as trigger 48, are used for most of the microprocessor inputs and outputs as these devices help reduce the signal variances associated with electrical noise.

The program line output 69 is activated by the microprocessor 60 only if a subsequent signal unit is present in the system. In a preferred embodiment, the last signal unit of the system is terminated such that its program line output is a "low" voltage output. Thus, if the signal unit of FIG. 2 is the last signal unit in the system, input 61 to microprocessor 60 will not be activated. Alternatively, if the signal unit of FIG. 2 is not the last unit in the system, input 61 will be activated. Depending on the input at 61 and instructions from the master console, microprocessor 60 may control transistor 66 to cause it to switch the program line output at 69 to either "high" output or "low" output.

The third communication function of microprocessor 60, in addition to receiving and transmitting program line input and output signals respectively, is to control all other data communications between the network and the signal unit over the RS-485 transceiver 70. In the preferred embodiment the transceiver 70 is the Maxim Corporation's MAX487 transceiver. The transceiver 70 of the signal unit transmits or receives electrical signals to or from twisted pair conductors 71, 72, which comprise the information conductors of the network bus. When receiving from the network, transceiver 70, on line 63, outputs a digital signal to the microprocessor based on the difference between the input voltages on the twisted pair conductors; a digital "high" signal will be output on line 63 and input to the microprocessor if the signals at 71 and 72 differ by +200 mV or higher and a digital "low" signal will be output on line 63 if the difference between 71 and 72 is less than −200 mV. When transmitting to the network, the microprocessor 60 will output, at line 64, digital signals to transceiver 70 which will convert these signals to a differential signal which may be transmitted over the network.

The components and interconnections of the typical signal unit of FIG. 2 have now been described and a functional explanation of the signal unit's apparatus and method of generating a count of the number of articles passing along an article path will now be made.

As articles pass along the article path, they interfere with the beam from LEDs 50 and, as a result, photodetector 52 receives less light and produces a lower voltage signal. As described above, circuit 53 then receives and amplifies the difference between the peak signal and the signal excursion. The modified photodetector signal is subsequently received by microprocessor 60 for a determination of the number of articles passing along the article path.

FIG. 5 is a graph of a typical output signal from circuit 53. In particular, FIG. 5 represents two articles passing along an article path and interfering with the beam from LEDs 50. In FIG. 5, time is represented on the x-axis and signal magnitude is represented on the y-axis. FIG. 5 also includes twenty-four vertical lines, indicated by reference numerals 160–183, which represent twenty four sampling intervals of the microprocessor 60. The intersection of the modified photodetector signal with a sampling line represents the magnitude of the modified photodetector signal at that point in time. The sampled magnitude of the signal corresponds to an eight bit digital value shown on the y-axis ranging from 0 to 255.

More particularly, FIG. 5 is a graph of two articles passing along an article path during a single "article event." An "article event" is defined as the interval between the time that at least one passing article begins interfering with the beam(s) and the time that such article(s) have momentarily stopped interfering with the beam. In FIG. 5, the article event begins at the point in time corresponding to sample point 165 and ends at the point in time corresponding to sample point 177. As is apparent, suitable thresholds are used to determine the beginning and ending points of an article event.

Microprocessor 60 receives the modified photodetector signal from circuit 53 at its analog to digital input port, samples the signal at a 5 kHz sampling rate, and returns an eight bit value. As microprocessor 60 receives the digitized pulse train corresponding to the sampled signal, it will compare the digitized value with one of two thresholds. The first threshold is the article event start threshold and if the digitized value of the modified photodetector signal exceeds the first threshold, the microprocessor generates and stores a signal indicating that an article event has begun. This stored signal is the article event "flag." The second threshold is the article event stop threshold and if the digitized value of the modified photodetector signal exceeds the stop threshold, the microprocessor generates a new signal indicating that the article event has stopped. Once the article event has stopped, microprocessor 60 clears the article event flag which previously indicated that an article event had begun.

Thus, if the article event flag has not yet been set, microprocessor 60 will compare the digitized signal with the article event start threshold to determine whether an article event is occurring. On the other hand, if the article event flag has been set, microprocessor 60 will compare the digitized signal with the article event stop threshold to determine if the article event is still ongoing.

Once the article event flag is set, microprocessor 60 begins storing data related to the digitized signal in its memory and also begins generating additional signals. In one embodiment, the microprocessor generates a duration signal and an area signal. The duration signal represents a running total of the time of the event and the area signal represent the integral of the magnitude of the sampled signal over the time of the article event. Microprocessor 60 also generates and stores an arithmetic mean area signal which is a signal representative of the sum of a number of area signals divided by the total number of corresponding article events.

The arithmetic mean area signal is used by microprocessor 60 for a variety of functions. One important function is determining the amplification of circuit 53 as illustrated in FIG. 4. Thus, returning to FIG. 4, it is seen at 101 that if the arithmetic mean area exceeds a first predetermined threshold, the articles that are passing are "very large" and the default minimum gain should be employed in circuit 53 on both selection lines. Alternatively, as seen at 102, if the arithmetic mean area signal is beneath the first threshold but exceeds a second threshold, the articles that are passing are "large" and the first selection line are set at 103 such that the first selection line is set to minimum gain and the second selection line is set to maximum gain. Another alternative as indicated at 104 is that the arithmetic mean area signal may be beneath the first and second threshold signals but exceeds a third threshold signal. If this is the case, the selection lines are set at 105 such that the first selection line is set to maximum gain and the second selection line should be set to minimum gain. The final alternative is that the arithmetic mean area is beneath all thresholds. In this case, as indicated at 106, both selection lines are set to maximum gain. In the preferred embodiment, this process of gain adjustment is performed only once, after the first 128 seed events. However, this gain adjustment may be performed many times at either constant frequency or random intervals in order to optimize system performance and automatically adjust for different article sizes.

Based on the digitized signal and on the additional generated signals, such as duration, area, arithmetic mean area and the like, microprocessor 60 may determine the number of articles which passed along the article path during the article event. In one embodiment of the invention, the number of articles is determined from the duration signal and from the area signal by reference to a previously determined data array. In another embodiment of the invention, the number of articles is determined based on the microprocessor generated signals through the use of fuzzy logic.

In the data array embodiment of determining the number of articles that passed within a single article event, a data structure is used to relate article event parameters such as duration and area to a particular number of articles for that article event. The data structure thus defines the number of articles within an article event as a function of at least two variables: article event duration and area. To be useful for a variety of different article events, the data structure must be normalized. In the preferred embodiment, the data structure is normalized based on the arithmetic mean and harmonic mean of the duration and area signals of known samples.

In order to construct the data structure, a known sequence of articles are passed through the article path in order to create varying but known numbers of articles per article event. As the articles are passed along the path, data is collected and recorded which relates article event duration and area to the known number of articles in the single article event. For example, two articles may be passed through the article path simultaneously to determine the duration and area for a single article event with two known articles passing in the event. Another sequence may involve recording duration and area data for the sequential passage of two or three partially overlapping articles within a single article event.

After the data is collected, it is normalized based on the arithmetic and harmonic mean of the obtained duration and area values. The resultant data structure is then stored in microprocessor 60 memory as a two dimensional array with separate integer indices corresponding to duration and area.

In operation, the data array is used by the microprocessor as a look-up table to obtain the number of articles which passed during the article event. Microprocessor 60 retrieves the stored duration and area signals and normalizes these values based on a "nominal" duration value and a "typical" area value respectively. In order to normalize the duration value for the article event, it is divided by a "nominal" duration value, multiplied by a constant and rounded to the nearest integer. Similarly, the area value for the article event is divided by a "typical" area value, multiplied by a constant and rounded to the nearest integer. As integers, the normalized duration and area values are easily used as indices to look up the number of articles per article event in the described two dimensional data structure. Hence, the number of articles per article event is easily referenced in the data structure after the duration and area signals are normalized.

At start-up, the "nominal" duration and "typical" area values are predefined variables based on empirical data. However, beginning with the first article event, the microprocessor begins to store information related to the nominal and typical values of each article event. After 128 article events, in the preferred embodiment, the nominal duration and typical area values are recalculated based on the following formulae:

$$\text{Nominal} = \overline{X}_{Duration} * \left[ \left( 1.223361 * \frac{\overline{H}_{Duration}}{\overline{X}_{Duration}} \right) - 0.23718 \right]$$

Typical =

$$\overline{X}_{Area} * \left\{ \left\{ 1.533438 * \left[ \left( 1.223361 * \frac{\overline{H}_{Duration}}{\overline{X}_{Duration}} \right) - 0.23718 \right] \right\} + \left\{ 0.218402 * \frac{\overline{H}_{Area}}{\overline{X}_{Area}} \right\} - 0.65578 \right\}$$

Where $$\overline{X} = \frac{1}{n} \Sigma x_{sample}$$

and $$\frac{1}{\overline{H}} = \frac{1}{n} \Sigma \frac{1}{x_{sample}}.$$

Following start-up, the values for "nominal" duration and "typical" area are recalculated every 128 article events. Thus, the normalized values of duration and area for a particular article event will be determined based on the nominal and typical values for the preceding 128 article events.

This method of normalizing the data based on the most recent article events is an important feature of the invention and allows the article sensors of the invention to adapt to the actual articles passing along the article path. Thus, the typical signal unit will be less likely to miscount the number of articles if the nominal duration or typical area of an article event changes dramatically from the initial default values.

Another embodiment of the invention determines the number of articles per article event through the use of a fuzzy logic. In the fuzzy logic embodiment, the microprocessor compares the actual duration signal with four duration classification signals to determine the percent membership of the duration signal within each classification: a "nominal" signal, a "short signal" equal to one half the value of the nominal signal, a "long" signal equal to twice the value of the nominal signal, and a "very long" signal equal to three times the value of the nominal signal. The microprocessor also compares the actual area signal with four area classification signals to determine the percent membership of the area signal within each of its classifications: a "typical" signal, a "small" signal equal to one half the value of the typical, a "large" signal equal to twice the value of typical, and a "very large" signal equal to three times the value of typical. Depending On the percent membership of each signal in its classification, the number of articles in the article event is determined.

Figure 9A:
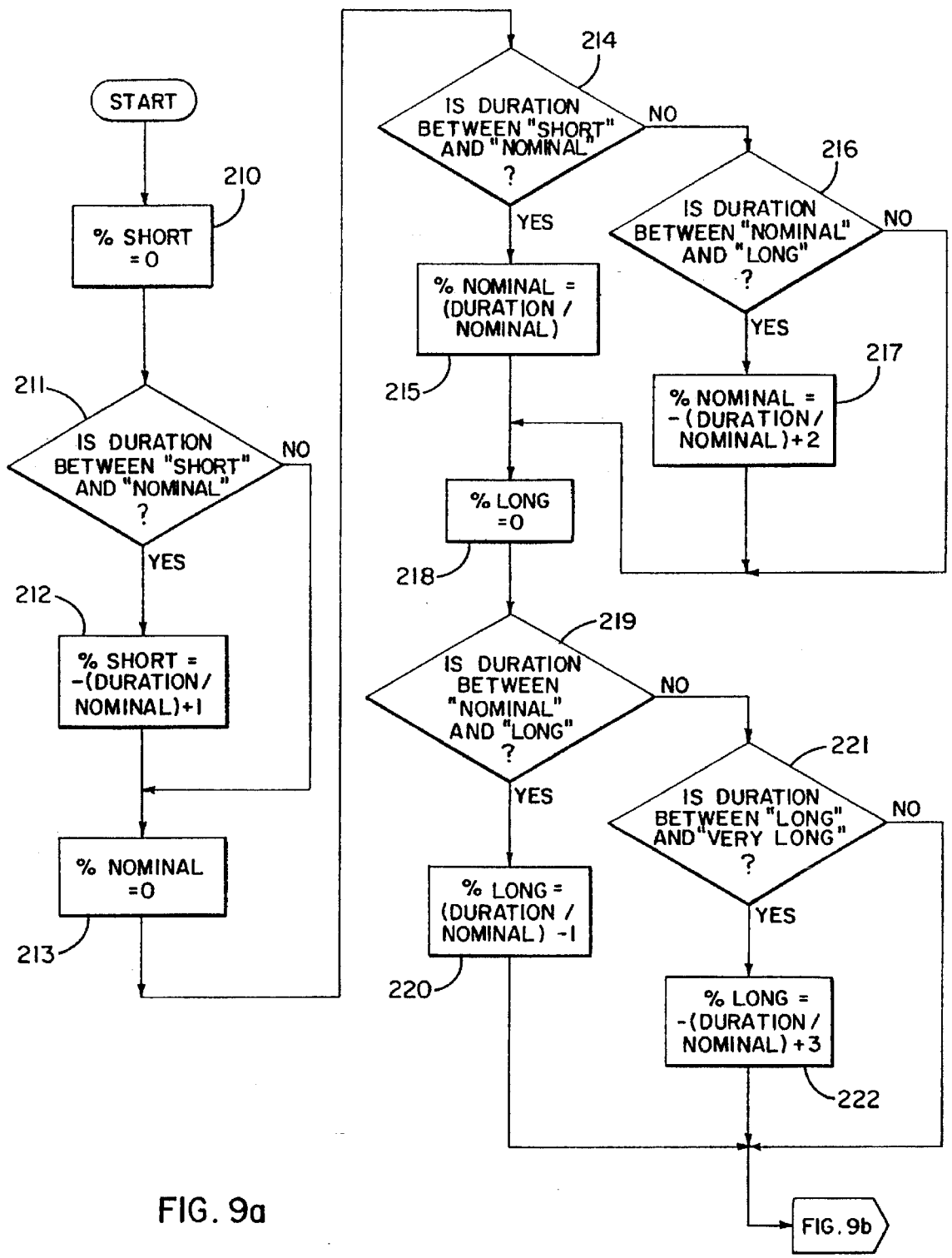
FIGS. 9a, 9b, 9c and 9d illustrate a diagram representing a fuzzy logic flow sequence which is used for determining the number of articles in an article event.

One example of the flow of the fuzzy logic is illustrated in FIGS. 9a–9d. Referring to FIG. 9a, after microprocessor 60 determines that the article event has ceased, it begins the sequence at 210 to determine the number of articles that passed in that article event. First, at 210, microprocessor 60 assumes that the percent membership of the signal in the "short" classification is zero. Next, as illustrated by the decisional 211, microprocessor compares the duration signal with the short signal and the nominal signal. If the duration signal is between short and nominal, as indicated at 212, the percent membership in the short classification is the opposite of the quotient of the duration and the nominal signal plus 1.

If the outcome of 211 is such that the duration is not between short and nominal, the logic proceeds to 213 where it is assumed that percent membership in the nominal classification is zero. Then, at decisional boxes 214 and 216, microprocessor 60 determines whether the duration is between short and nominal or whether the duration is between nominal and long. Depending on the outcome of these decisions, the percent membership in the nominal classification is as indicated in assignment boxes 215 and 217.

Next, the actual duration membership in the long classification is determined. As indicated at 218, microprocessor 60 first assumes that percent membership in the long classification is zero. Then, at decisional boxes 219 and 221, microprocessor 60 determines whether the duration is between nominal and long or whether the duration is between long and very long. Depending on the outcome of these decisions, the percent membership in the long classification is as indicated in assignment boxes 220 and 222.

Figure 9B:
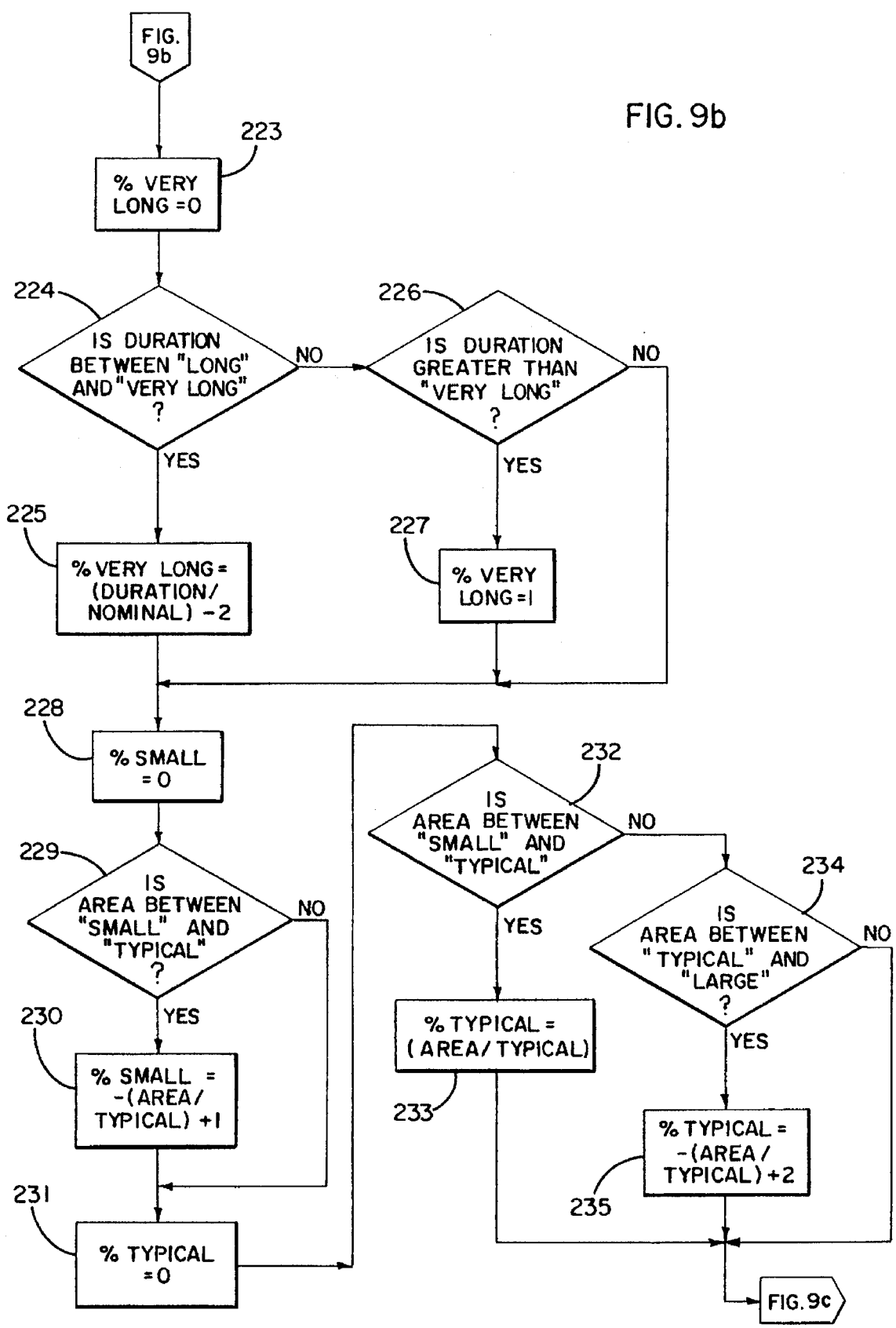
Figure 9C:
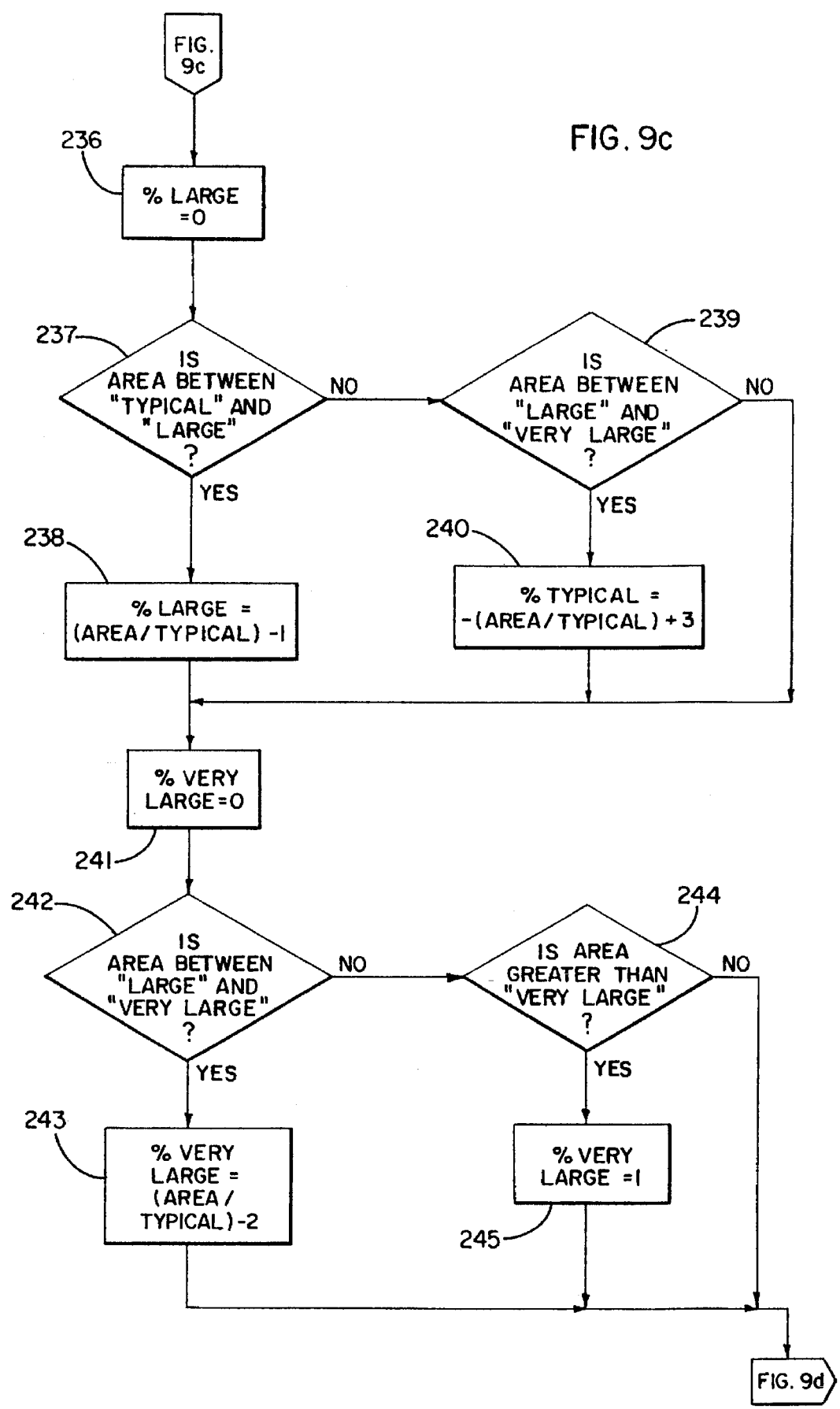

Next, turning to FIG. 9b, the actual duration membership in the very long classification is determined. As indicated at 223, microprocessor 60 first assumes that percent membership in the very long classification is zero. Then, at decisional boxes 224 and 226, microprocessor 60 determines whether the duration is between long and very long or whether the duration is greater than very long. Depending on the outcome of these decisions, the percent membership in the very long classification is as indicated in assignment boxes 225 and 227.

Beginning at 228 in FIG. 9b, the logic determines the percent membership of the area signal in each of its respective categories: small, typical, large, and very large. In a manner similar to determining the percent membership of the duration signal, the logic proceeds in the remainder of FIGS. 9b and 9c to determine the classification of the area signal.

Figure 9D:
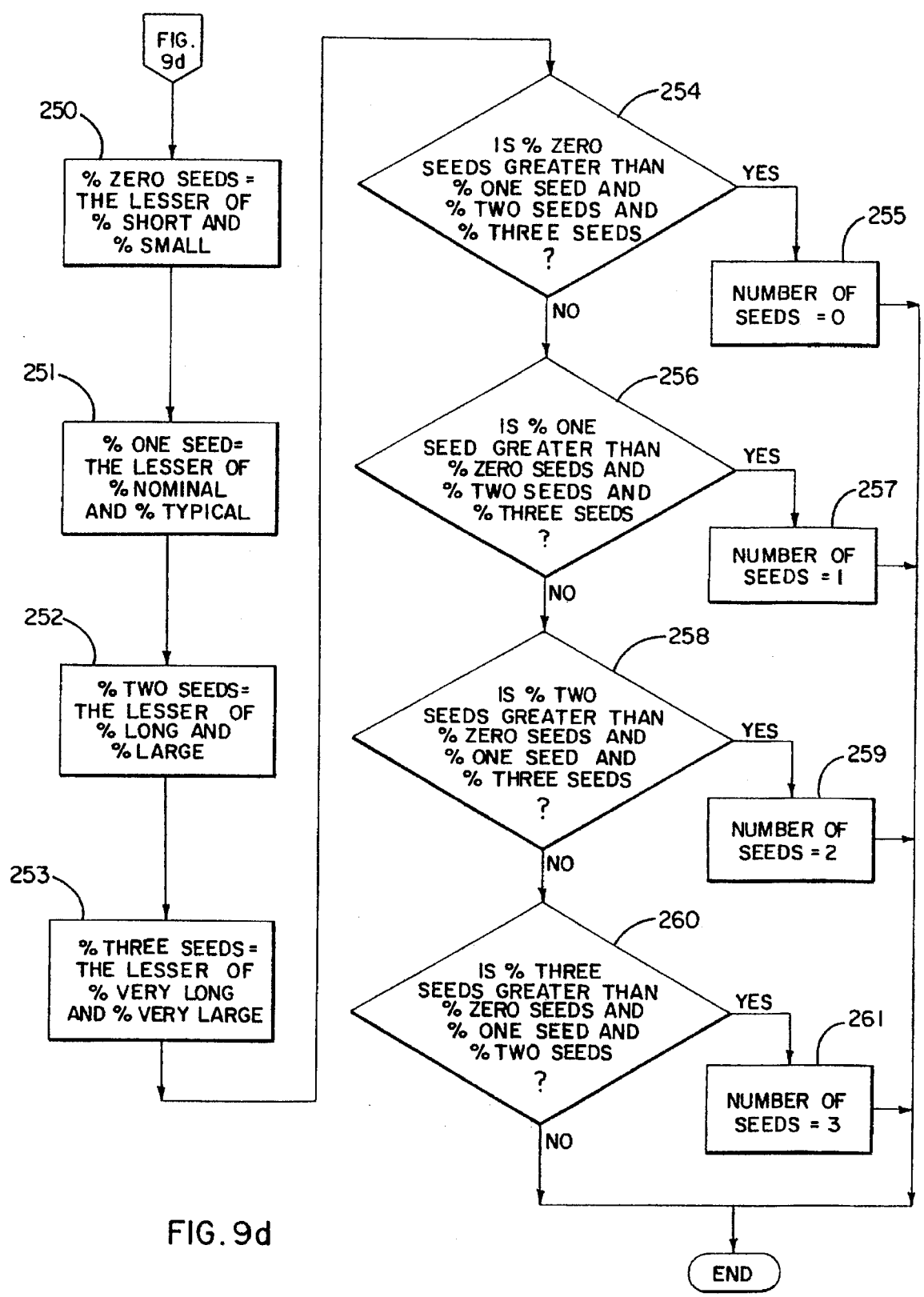

Beginning at 250 in FIG. 9d, microprocessor 60 determines the overall article event's percent membership in the categories indicating zero articles, one article, two articles, or three articles based on the percent membership of the duration and area signal in each category. This determination is made by assigning the percent membership for the article event in each category as indicated in assignments 250–253.

The final step of determining the number of articles in an article event through the fuzzy logic embodiment of FIGS. 9a–9d is indicated by decision boxes 254, 256, 258, and 260, where the number of articles is greatest of the article event's membership in a particular article classification. It is noted that the logic illustrated in FIGS. 9a–9d is representative of only one method of implementing the fuzzy logic and many other variations are possible and may be implemented by one skilled in the art.

Thus, microprocessor 60, by data array, fuzzy logic or other implementation means, i.e. neural networks, may accurately determine the number of articles which pass within a single article event and, from this information, microprocessor 60 may accurately generate and maintain a count of the total number of articles which passed along the article path. Microprocessor 60 therefore constantly evaluates the incoming modified photodetector signal for the presence of an article event and, if an article event is detected, determines the number of articles in that article event. The microprocessor 60 then maintains a running sum of the total number of articles and the total number of article events.

However, in addition to accurately counting the number of articles within an article event and the total number of articles passing along an article path, microprocessor 60 can perform additional important functions within the signal unit.

An example of one such additional function is that microprocessor 60 provides the signal unit with the ability to self-test the operation of LEDs 50 and photodetector 52. As noted above, LEDs 50 generate a beam depending on the current from constant current source 51 which is, in turn, dependent on the input signal at 57 to the constant current source 51. Thus, microprocessor 60 may control the operation of LEDs 50 by switching the constant current source 51. In a self-test mode, microprocessor 60 repeatedly switches constant current source on and off a known number of times and thereby cycles the LEDs 50 on and off a known number of times. Microprocessor 60 then compares the received signal from circuit 53 with an expected received signal stored in microprocessor 60 memory. If an out of tolerance discrepancy exists between the actual received signal from circuit 53 and the expected received signal from circuit 53, microprocessor 60 will detect an error and will either store an error code or indicate to the master console that a problem exists in the optics of the signal unit.

Another example of an additional function added by microprocessor 60 is the ability to detect when an article was "skipped," i.e. not dispensed, by the dispensing system. For many reasons, dispensing systems sometimes fail to pass articles along the article path. For example, in a seed dispensing system which uses an air-vacuum device to dispense seeds one at a time along the article path, the vacuum device may become momentarily blocked and fail to drop seeds. In the prior art, it was difficult, if not impossible, to determine when, where, and how many seeds were skipped. In the invention, the microprocessor 60 is able to determine a missing article event by comparing interval between article events.

Figure 8:
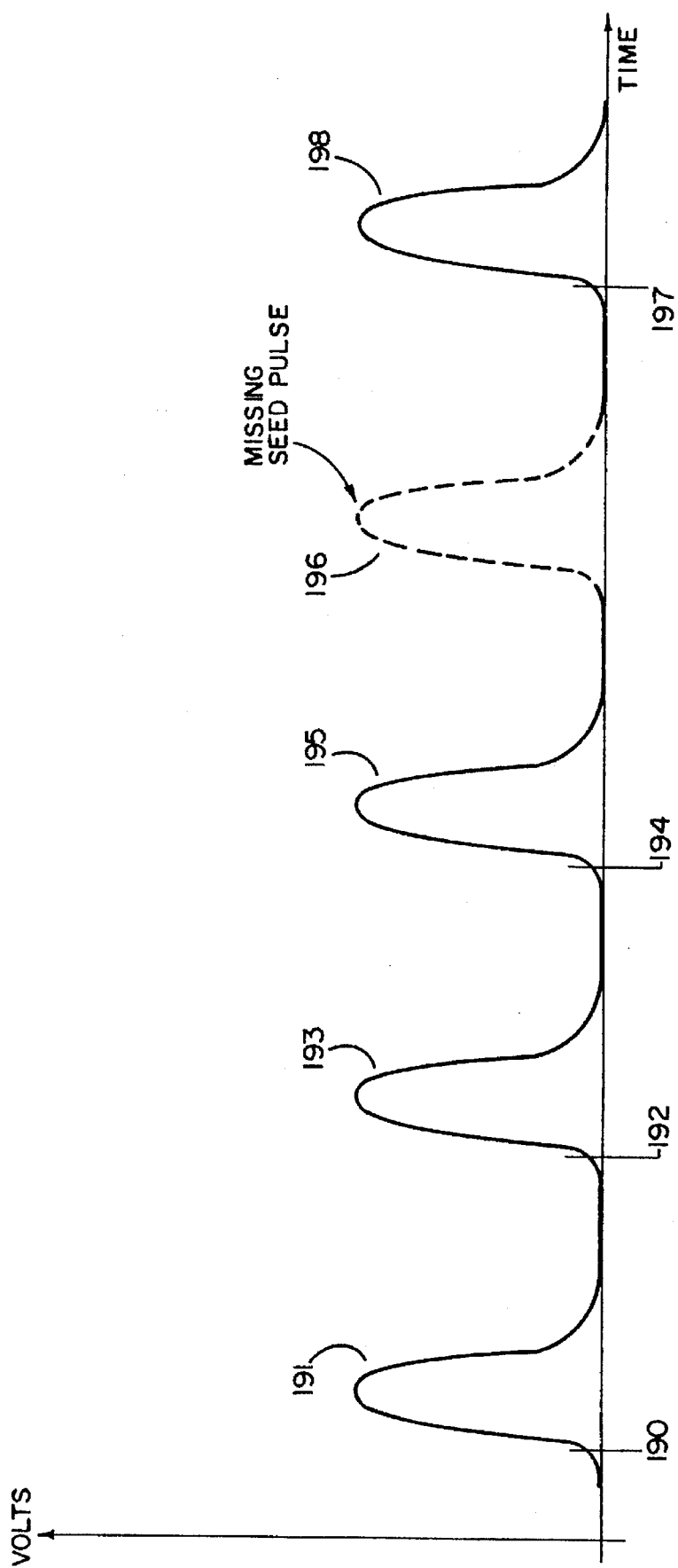
FIG. 8 is a graphical representation of a typical detector circuit's output signal for many article events where an expected article event is missing.

FIG. 8 illustrates a series of article events with one expected article event missing. As illustrated, microprocessor 60 determines the first article event 191 at time 190, the second article event 193 at time 192, the third article event 195 at time 194, and the fifth article event 198 at time 197. According to the invention, microprocessor 60 stored the article event start and duration times of each article event as well as the number of articles per article event. From this information, microprocessor 60 is able to determine an average duration between article events, i.e. the average duration between events 191, 192, 193, etc. Microprocessor 60 then compares average duration with the measured duration between events and, if the measured duration is unduly long, microprocessor 60 determines that an article was skipped. Microprocessor 60 then stores the time and the number of articles that were skipped in memory and, upon inquiry from the master console, reports this information. The ratio between missed events and counted events can therefore be calculated and presented to the user to identify possible seed spacing constancy problems.

With the foregoing component and functional description of the signal unit of FIG. 2, a more detailed overall system description will now be made.

Thus, returning to FIG. 1, it is noted that the master console may directly share information with every signal unit over the two information conductors in the network or may indirectly address the signal units through each signal unit's program line in. All nodes on the network, i.e. the master console as well as every signal unit, directly receive all information signals transmitted over the RS-485 network. Thus, information that is intended for a specific node will be received by all nodes but only acted upon by the node destined for the information. On the other hand, the master console 1 uses the program line, in conjunction with the direct network RS-485 connection, to address and program only individual signal units.

The master console 1 and the rest of the signal units transmit information over the network in a specific sequence with a specific packet protocol that is common to and recognized by all of the nodes on the network. In the preferred embodiment, as indicated in FIG. 1, only one master console 1 is present in the system. This master console is responsible for transmitting information to the signal units and for issuing requests for information to the signal units. In the preferred embodiment, the individual signal units are responsive only and do not independently address the master console or other signal units. Rather, the signal units transmit information onto the network in response to a specific information query from the master console.

Figure 6A:
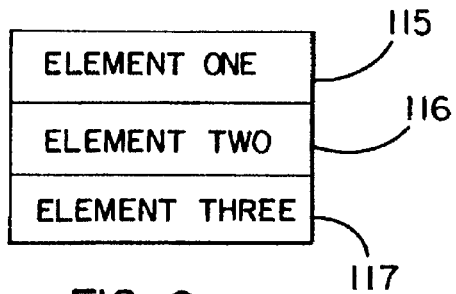
FIGS. 6a–6b are diagrams representing the typical information packet sent from the master console to an individual signal generating and processing unit and from an individual signal generating and processing unit to the master console.
Figure 6B:
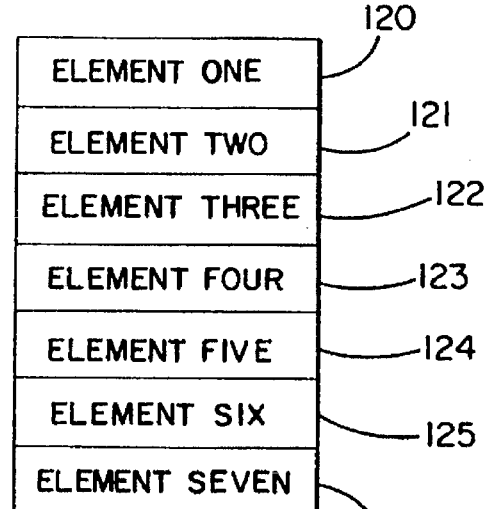
Figure 7:
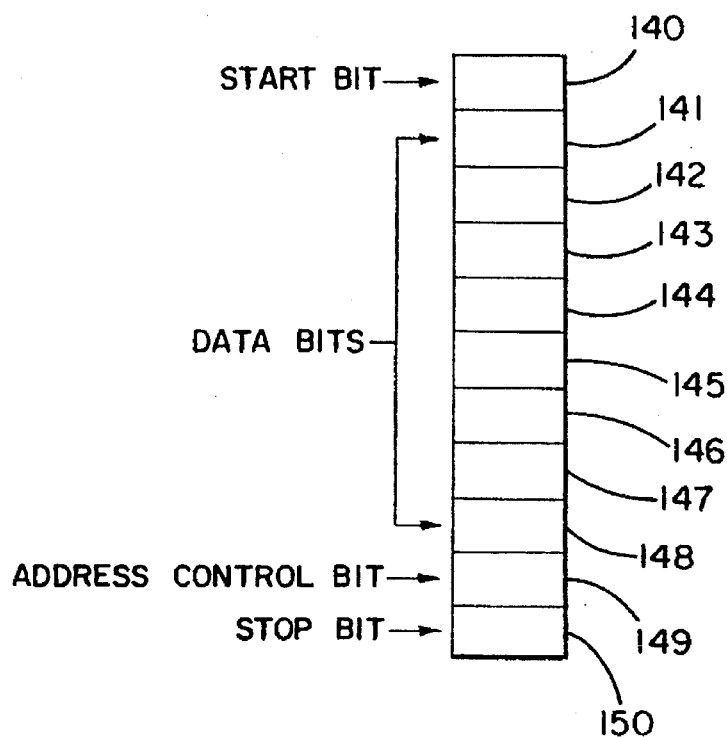
FIG. 7 is a diagram representing a typical bit structure of an information element.

FIGS. 6a and 6b illustrate the data elements of the two types of packets used to transmit information over the network and FIG. 7 illustrates the bit structure of every data element illustrated in FIGS. 6a and 6b. The start and stop bits, 140 and 150, of FIG. 7 are used as control bits to control the asynchronous communication, the data bits 141–148 contain data to be transmitted over the network, and the address control bit 149 is set high when the transmitted data is an address. As shown in FIG. 6a, the master console transmits information or requests for information over the network in a three data element packet and, as shown in FIG. 6b, the signal units transmit information in seven data element packets. The first data element 115 of FIG. 6a, corresponding to the three element packet from the master console 1, is always an address corresponding to an individual signal unit or to a category of signal units. Thus, the eight data bits 141–148 of the first data element 115 contain a value ranging from 0 to 255. In the first data element 115, the tenth bit 149, the address control bit, of the data element is also set to "1" to indicate that the data bits contain an address. Thus, the nodes on the network may easily distinguish the address data element from the subsequent elements by checking the state of the address control bit. Consequently, only the signal unit or units with a matching address will act on the information or request for information that follows.

The second data element 116 of the three element packet of FIG. 6a contains the information or the request for information within the data bits 141–148. In the second data element, the address control bit 149 is set to 0. The request for information is a value ranging from 0 to 255 which represents a code understood by the signal unit. For example, if the second element 116 is comprised of a value corresponding to decimal 9, the addressed signal unit will decode this value into a request to transmit information relating to the number of occurrences of multiple articles passing in a single article event. The codes are predefined and are stored by every signal unit for later reference.

The third data element 117 of the three element packet contains checksum information used for error detection purposes. If the least significant byte of the sum of the data in the three data element packet does not equal a predetermined sum, the message was erroneously transmitted and will be ignored.

After the master console 1 sends its three data element packet, it waits for the appropriate response from the addressed signal unit(s). If the appropriate signal unit does not respond with the requested information within a predetermined amount of time, the signal unit will resend the request. FIG. 6b illustrates the seven data element packet that the signal units send in response to a request for information.

Data element one 120, element two 121, and element seven 126 of the seven element packet contain planned information. The first data element 120 of the seven data element packet of FIG. 6b contains the address information of the signal unit. This enables the master console to verify that the correct signal unit has transmitted the requested information. In contrast to the first data element 115 of the three data element packet, the first data element 120 of the seven data element packet has the address control bit 149 set to 0.

The second data element 121 contains command and error status information in which the data bits contain the request code transmitted by the master console. Thus, upon receipt of from the signal unit, the master console may verify that the signal unit has the correct request. The seventh data element 126 of the seven data element packet contains the same checksum information that is described above for the third data element 117 of the three data element packet. Thus, transmission error detection is used by both types of packets to verify communications.

The non-planned and intervening four data elements 122–125 of the seven element data packet contain the requested information within the data bits 141–148 of each element. If the information to be transmitted does not require four data elements, the non-used elements will be set to the null string. Otherwise, the data bits 141–148 of each element contains a single byte of information. In the case where numbers greater than 255 are to be transmitted onto the network, the data elements will be transmitted in two bytes in succeeding data elements. For example, if master console 1 requests the number of articles which have passed, the number of articles to be returned may exceed 255. Hence, upon this request from the master console, the third data element 122 will contain the high byte of information and the fourth data element 123 will contain the low byte of information. Thus, depending on the request, the returned data elements contain a specific sequence of information.

Before the communication system is fully operable, each signal unit must be assigned a unique address. In the preferred embodiment, the master console assigns a unique address to each signal unit when the system is initially powered. In order to assign addresses, the master console uses both the RS-485 and the program line inputs. The master console sends the actual addresses over the RS-485 conductors and identifies a particular signal unit to receive the address through the program line input.

Referring to FIG. 1, at system start-up the master console 1 first changes its program line output 2, which corresponds to the program line input 7 of the first signal unit, from high to low. The first signal unit, its program line input. 7 now being low, recognizes that the master console is attempting to assign its address. The console first sends a global address as the first data element, a begin address assign signal as the second data element and checksum as the third data element of the three element packet. The signal unit, whose program line in is "low" responds by returning its signal unit type and whether another signal unit is present. The master console stores information and then sends a unique address over the network as a first data element, a conclude address signal as the second data element and checksum information as the third data element of the three data element packet. The microprocessor of the first signal unit receives the address from the first data element over the RS-485 transceiver and stores the address in a memory location in the microprocessor.

After the address is stored, the signal unit responds to the conclude address signal, the second data element from the master console, and sends information back to the master console to re-confirm the signal unit's type and whether another signal unit is present. If another signal unit is not present, the master console ceases assigning addresses. If another signal unit is present, however, the first signal unit changes the state of its program line output from high to low and the next signal unit is prepared to receive the next three element begin address assign data packet and the three element conclude address assign data packets transmitted over the network from master console. In this manner, the master console sequentially assigns addresses throughout the system until no further signal units remain to be addressed.

At times, a signal unit, for one reason or another, may lose its stored address. In a manner similar to that described above, the signal unit whose address has been lost will have its old address reassigned. First, the master console determines that the signal unit is not responding to requests for information. The master console will then address the preceding signal unit and direct that signal unit to switch the state of its program line output from high to low. The lost address signal unit's program line input will accordingly switch from high to low and this signal unit will receive the three data element begin address assign and three data element conclude address assign packets from the master console with the old address. In this manner, every signal unit may be addressed either globally at start-up or individually as necessary.

Through the use of the combined information pathways, the master console 1 may perform a vast number of system responsibilities. One of the most important functions of the master console is to compute and display the total article count of the entire dispensing system. The master console performs this primary function by requesting and receiving the article count from each signal unit over the RS-485 conductors and then computing a combined sum from all of the signal units. The master console may then display this information in a variety of manners depending on the display type.

The sole limitation on the display of the master console 1 is that it display basic information relating to the number of articles which have been dispensed. However, any suitable display capable of displaying this information in any form is within the scope of the invention. Thus, LCD displays, CRT displays, flat panel displays, printers and the like may be used in combination with appropriate input devices such as keyboards or membranes and associated hardware circuits and switches as well as software drivers to display any of the information obtainable and/or stored by the master console.

Other objects, features, and advantages of the present invention will be more readily apparent upon reading the above description. It should be understood that the detailed description and specific embodiment are given by way of illustration only, since various changes and modifications within the spirit and scope of the invention will become apparent to those skilled in the art from this detailed description. For example, signal unit nodes on the network need not be limited to article detectors; other functions such as vacuum and pressure measurement may be accomplished through the use of signal unit nodes, thereby permitting the master console to monitor and display such information as well.

What is claimed is:

1. A signal generating and processing device comprising:
   a sensor adjacent an article path which generates a sensor signal in accordance with physical characteristics of articles passing along said article path;
   a signal conditioning circuit connected to said sensor which receives said sensor signal and generates a conditioned sensor signal having a magnitude proportional to said sensor signal;
   a logic unit electrically connected to said conditioning circuit which receives said conditioned signal and generates
   a count signal representative of the magnitude of said amplified signal,
   a duration signal representative of the amount of time that said count signal exceeded at least one predetermined threshold, and
   an area signal at least approximating the integral of said count signal over the time corresponding to said duration signal; and
   a number signal generating module within said logic unit which receives said duration signal and said area signal and generates a number signal representative of a number of articles which passed along said article path during the time represented by said duration signal.

2. A signal generating and processing device according to claim 1 wherein said number generating module generates said number signal by reproducing a single data signal stored in a multi-dimensional array.

3. A number generating module according to claim 2 wherein said number generating module generates a normalized duration signal representative of said duration signal and a normalized area signal representative of said area signal.

4. A number generating module according to claim 3 wherein said multi-dimensional array is a two dimensional array with said number signal stored in a memory location indicated by said normalized duration signal and said normalized area signal.

5. A number generating module according to claim 4 wherein said number generating module generates
   a nominal duration signal and a typical area signal and,
   generates said normalized duration signal by dividing said duration signal by said nominal duration signal and rounding the quotient and
   generates said normalized area signal by dividing said area signal by said typical area signal and rounding the quotient.

6. A number generating module according to claim 5 wherein said nominal duration signal and said typical area signal are updated over time depending on said physical characteristics of said articles.

7. A signal generating and processing device according to claim 1 wherein said logic unit generates at least one feedback signal and said conditioning circuit
   receives at least one of said feedback signals generated by said logic unit, and
   generates said conditioning signal by inverting and amplifying said sensor signal by an amount which is a function of said feedback signal.

8. A signal generating and processing device according to claim 1 wherein said logic unit is a microprocessor including a universal asynchronous receiver and transmitter, a plurality of input ports, a plurality of output ports, an analog to digital convertor, a memory, and an arithmetic unit.

9. A signal generating and processing device according to claim 1 wherein said articles are seeds.

10. A signal generating and processing device according to claim 1 wherein said sensor signal and said conditioned signal are analog signals.

11. A signal generating and processing device according to claim 1 wherein said sensor is comprised of at least one LED and one photosensor.

12. A signal generating and processing device according to claim 11 wherein said logic unit may control the operation of said at least one LED.

13. An article counting system for counting a total number of articles comprising:
   (a) a plurality of separate article counting devices, each of which contains
   (1) an article path,
   (2) a sensor adjacent an article path which produces sensor signals in accordance with characteristics of at least one article passing along said article path,
   (3) a circuit for conditioning said sensor signals,
   (4) a sensor signal generating and processing unit which receives said sensor signals and generates a count signal corresponding to the number of articles passing in said article path,
   (5) at least one memory area capable of storing electrical signals,
   (6) an accumulator which receives said count signal and generates an accumulated count signal corresponding to the sum of the count signals for a predetermined time, and

21

(7) a communication controller which receives said accumulated count signal after said predetermined time and generates an output count signal;

(b) a master unit which receives each output count signal from each article counting device and accumulates a total count signal, and (c) a communication network which electrically connects each article counting device to each other and to said master unit.

14. An article counting system according to claim 13 wherein said sensor signal generating and processing unit of said article counting device also generates signals representative of the number of missed articles and the number of articles per article event.

15. An article counting system according to claim 13 wherein said master unit includes a visual display device for displaying a variety of symbols representative of information collected by said counting system.

16. An article counting system according to claim 15 wherein said symbol is a number.

17. An article counting system according to claim 13 wherein said communication network includes a power supply line, a ground line and a common information bus.

18. An article counting system according to claim 17 wherein said master unit and each of said article counting devices has a control line output.

19. An article counting system according to claim 18 wherein each of said article counting devices has a control line input.

20. An article counting system according to claim 19 wherein said communication network further connects said master unit and each of said article counting devices to each other by electrically connecting said control line output of said master unit or of a preceding article counting device to a control line input of a subsequent article counting device or to an electrical ground if no subsequent article counting devices exist.

21. An article counting system according to claim 20 wherein said master unit transmits data signals to each of said article counting devices at the same time on said common information bus.

22. An article counting system according to claim 21 wherein said data signals comprise discrete data packets of information, each of said data packets including at least one discrete data element.

23. An article counting system according to claim 22 wherein said data element comprises a start bit, a stop bit, eight data bits, and a further control data bit.

24. An article counting system according to claim 23 wherein said master unit generates address signals and transmits said address signals as a portion of a data element within an information packet transmitted on said information bus.

25. An article counting system according to claim 24 wherein each of said article counting devices is capable of receiving a unique address signal and storing said address signal in said memory when said control line input is receiving a predetermined signal.

26. An apparatus for counting articles passing along an article path comprising:

a sensor adjacent the article path for generating a signal in accordance with characteristics of at least one article passing along the article path, said signal progressing

22 from a quiescent level through a first threshold level to a peak level and back through a second threshold level to said quiescent level as said at least one article passes said sensor;

means receiving said signal for measuring the duration of time between the time that said first threshold level is reached and the time that said second threshold level is reached;

means receiving said signal for approximately integrating said signal over said duration thereby generating an area measurement; and output means responsive to said duration and said area measurement for producing an output signal representative of the number of articles passing said sensor during said duration.

27. A planter monitoring system comprising a master unit, a plurality of signal units and a network bus interconnecting the master unit and signal units, each of the signal units including a sensor disposed adjacent a seed path for generating a signal in accordance with the passage of seeds along the path and a processor receiving said signal and generating therefrom a count value corresponding to a number of seeds having passed along the path, the master unit receiving via the network bus the count value from at least one of the signal units and generating output display information corresponding to seed passage, the network bus comprising a differential pair of information lines connected in common to each signal unit and the master unit.

28. A method of counting articles passing along an article path comprising:

generating a signal in accordance with characteristics of at least one article passing along the article path, said signal progressing from a quiescent level through a first threshold level to a peak level and back through a second threshold level to said quiescent level as said at least one article passes a point along the article path;

measuring the duration of time between the time that said first threshold level is reached and the time that said second threshold level is reached;

approximately integrating said signal over said duration thereby generating an area measurement; and, generating an article count from said duration and said area measurement.

29. The method of claim 28 wherein said step of generating an article count comprises rounding said duration and said area measurement and applying said rounded duration and said rounded area measurement as indices to a two dimensional array, the array containing predetermined article count values corresponding to varying combinations of durations and area measurements.

30. The method of claim 29 wherein said step of generating an article count comprises assigning a percent membership value of said duration within each of a predetermined number of discrete duration categories, assigning a percent membership value of said area measurement within each of a predetermined number of discrete area categories, and, based on said percent membership values and a predetermined correlation between said duration categories, said area categories and article count values, determining therefrom said article count.

* * * * *